United States Patent [19]
Latham et al.

[11] Patent Number: 5,837,590
[45] Date of Patent: Nov. 17, 1998

[54] ISOLATED VERTICAL PNP TRANSISTOR WITHOUT REQUIRED BURIED LAYER

[75] Inventors: Lawrence F. Latham, Garland; Theresa M. Keller, Houston, both of Tex.

[73] Assignee: Texas Instruments Incorporated

[21] Appl. No.: 869,646

[22] Filed: Jun. 5, 1997

Related U.S. Application Data

[63] Continuation of Ser. No. 599,267, Feb. 9, 1996, abandoned, which is a continuation of Ser. No. 310,610, Sep. 22, 1994, abandoned.

[51] Int. Cl.[6] ............................................... H01L 21/331
[52] U.S. Cl. ..................... 438/364; 438/370; 438/375; 438/377
[58] Field of Search ..................................... 438/335, 338, 438/339, 342, 364, 370, 374, 375, 377; 437/31, 32, 150; 148/DIG. 10; 257/592

[56] References Cited

U.S. PATENT DOCUMENTS

| | | |
|---|---|---|
| 3,391,035 | 7/1968 | Mackintosh . |
| 3,596,115 | 7/1971 | Conzelmann . |
| 3,698,077 | 10/1972 | Dahlberg ................................ 437/150 |
| 4,239,588 | 12/1980 | Morishita et al. ....................... 437/31 |
| 4,357,622 | 11/1982 | Magdo et al. ............................ 437/31 |
| 5,011,784 | 4/1991 | Ratnakumar ............................. 437/31 |
| 5,192,992 | 3/1993 | Kim et al. ................................. 437/31 |
| 5,208,171 | 5/1993 | Ohmi ........................................ 437/31 |

OTHER PUBLICATIONS

*Analysis and Design of Analog Integrated Circuits*, (Third Ed.) by Gray and Meyer, John Wiley & Sons, Inc. pp. 148–149 (1993).
S. Wolf & R.N. Tauber, "Silicon Processing for the VLSI ERA" vol. I, 1986 pp. 242–245, 296–299.

Primary Examiner—Charles L. Bowers, Jr.
Assistant Examiner—Leon Radomsky
Attorney, Agent, or Firm—Lawrence J. Bassuk; Richard L. Donaldson

[57] ABSTRACT

A vertical PNP transistor and method for making it provide a transistor in a surface layer (12), which may be an epitaxial layer, of P– type conductivity at a surface of a substrate (11) of P+ type conductivity. An isolation region (14) of N– type conductivity in the P– surface layer (12) contains a collector region (25) of P– type conductivity. A base region (30) of N type conductivity is contained in the collector region (25), and an emitter region (40) of P+ type conductivity is contained in the base region (30). The base region (30) may be provided with a higher N type impurity concentration than a P type impurity concentration of the collector region (25). At least the collector region (25) and the base region (30) may be self aligned. The collector region (25) may be of thickness of about 2.2 μm, the base region (30) of thickness of about 0.1 μm, and the emitter region (40) of thickness of about 0.4 μm. Although the transistor is vertically constructed, base and collector contacts (60 and 42–43) may be provided at a surface of the surface layer (12) opposite the substrate (11). A contact (62) may also be provided for the isolation layer (14) at the surface.

2 Claims, 2 Drawing Sheets

ISOLATED VERTICAL PNP TRANSISTOR WITHOUT REQUIRED BURIED LAYER

This application is a Continuation of application Ser. No. 08/599,267, filed Feb. 9, 1996, abandoned, which is a continuation of Ser. No. 08/310,610, filed Sep. 22, 1994, abandoned.

BACKGROUND OF THE INVENTION

1. Field of the Invention

This invention relates to improvements in integrated circuit devices and methods for making same, and more particularly to improvements in bipolar transistor devices and methods for making same, and still more particularly to improvements in vertical PNP transistors that may be formed without requiring a buried high conductivity layer.

2. Relevant Background

The fabrication of PNP transistors in integrated circuit (IC) structures has long been problematic. Typically, PNP structures have much less gain than NPN structures, and require isolation to avoid parasitic effects that reduce or destroy the performance of the devices. Generally, for example, in the construction of a lateral PNP transistor, a high conductivity buried layer is provided to ensure that the gain of any parasitic transistor formed with the substrate does not become too harmful to the lateral transistor. Such buried layers add to the fabrication expense of the devices, require high temperature processing which may limit the level of integration possible, and also may increase the spacings between devices.

In addition, lateral transistors generally suffer a disadvantage of having a limited emitter area through which current between the emitter and collector may be carried. This is in part due to the fact that the collector is usually laterally displaced from the emitter, with the base surrounding both structures. Current, therefore, typically flows only from the lateral sides of the emitter through the base material to the collector.

On the other hand, in the construction of a typical vertical, or substrate, PNP transistor, the substrate itself is generally used to serve as the collector of the transistor. As a result, the vertical transistor configuration is usually limited to uses in common-collector (or emitter follower) circuit applications. Also, in vertical transistor devices, although the emitter area problems of the lateral transistor described above are not such a problem, due to the relative impurity doping levels of the base and substrate (collector), construction of devices with narrow base widths are difficult to achieve. This results in relatively long emitter-to-collector transit times for the holes traveling across the base region, which in turn produces a low value for the current gain and a poor high-frequency response.

To address some of these problems, so-called double diffused PNP transistors have been proposed in which a vertical PNP transistor is formed in an N type epitaxial layer on a P– type substrate. The N type epitaxial layer, which may be grown in multiple layers, serves as an isolating tank to the remaining elements of the device which are diffused in multiple diffusion steps into the epitaxial layer. Such structures may be laterally isolated by diffused P sinkers or diffusion regions that extend from the surface of the structure continuously through the epitaxial layer to the underlying substrate. The substrate, sinkers, and N type epitaxial layer therefore provide a junction that can be reversed biased to isolate the remainder of the contained PNP device. Such devices, however, are relatively complex to construct, requiring multiple epitaxial growth steps, complex diffusion masking, and diffusion drive-in steps.

More and more, BiCMOS structures are becoming popular, having both bipolar transistors for power or high voltage capabilities, and CMOS devices for digital or logic capabilities. Often, CMOS logic structures are provided with a lightly doped epitaxial layer formed as a tank on a highly doped substrate. Often the substrate and epitaxial layer are of P type conductivity. It will be appreciated that if a PNP device is desired to be formed with such starting substrate structure, a high conductivity layer may be required to isolate a lateral device, and the base width problems described above would limit the gain and frequency response of a vertical device.

SUMMARY OF THE INVENTION

In light of the above, therefore, it is an object of the invention to provide an improved PNP transistor and method for making same.

It is another object of the invention to provide an improved PNP transistor that does not require a high conductivity buried layer.

It is yet another object of the invention to provide an improved PNP transistor that can be formed in conjunction with existing CMOS processes, and particularly on a P+ substrate having a P– epitaxial layer thereover.

It is another object of the invention to provide an improved PNP transistor that can be used in various configurations as a lateral transistor, yet with the emitter area and other advantages provided as a vertical transistor.

These and other objects, features and advantages of the invention will be apparent to those skilled in the art from the following detailed description of the invention, when read in conjunction with the accompanying drawings and appended claims.

According to a broad aspect of the invention, a PNP transistor is presented. The PNP transistor is constructed in a surface layer, which may be an epitaxial layer, of P– type conductivity at a surface of a substrate of P+ type conductivity. An isolation region of N– type conductivity in the P– surface layer contains a collector region of P– type conductivity. A base region of N type conductivity is contained in the collector region, and an emitter region of P+ type conductivity is contained in the base region. The base region may be provided with a higher N type impurity concentration than a P type impurity concentration of the collector region. At least the collector region and the base region are self aligned. The collector may be of thickness of about 2.2 $\mu$m, the base of thickness of about 0.1 $\mu$m, and the emitter of thickness of about 0.4 $\mu$m. Although the transistor is vertically constructed, base and collector contacts may be provided at a surface of the surface layer opposite the substrate. A contact may also be provided for the isolation layer at the surface.

According to another broad aspect of the invention, a PNP transistor is presented in a P– type conductivity surface layer on a P+ type conductivity substrate. The PNP transistor includes an isolation region of N type conductivity diffused in the surface layer. A collector region of P type conductivity is diffused within the isolation region. A base region of N type conductivity is diffused within the collector region. An emitter region of P type conductivity is diffused into the base region. At least the collector region and the base region are self aligned.

According to yet another broad aspect of the invention, a method for forming a PNP transistor is presented. According to the method, a surface layer of P– type conductivity is formed at a surface of a P+ type substrate. An isolation region of N– type conductivity is formed in the surface layer. A collector region of P– type conductivity is formed in the isolation region. A base region of N type conductivity is formed in the collector region, and an emitter region of P+ type conductivity is formed in the base region. In one embodiment, the step of forming a collector region comprises diffusing acceptor impurities into the isolation region and the step of forming a base region comprises diffusing donor impurities into the collector region.

The isolation region also may be formed in the surface layer by diffusing donor impurities into the surface layer. The steps of forming a collector region and forming a base region may be performed by successively introducing the collector region into the isolation region through a common window of a photomask wherein the base and collector are self aligned within the isolation region.

BRIEF DESCRIPTION OF THE DRAWING

The invention is illustrated in the accompanying drawing, in which.

In the various drawings, like reference numerals are used to denote like or similar parts. Additionally, the drawings are not necessarily drawn to scale.

DETAILED DESCRIPTION OF THE PREFERRED EMBODIMENTS

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

Figure 1A:
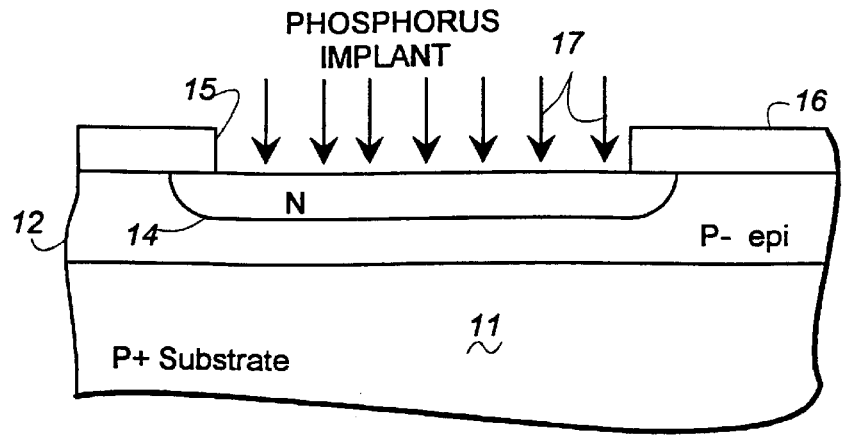
FIGS. 1a–1e are a series of cross sectional views showing a portion of an integrated circuit during the various steps of construction of a vertical PNP transistor, in accordance with a preferred embodiment of the invention, with a final transistor structure being shown in FIG. 1e.

Thus, according to a preferred embodiment of the invention, a PNP transistor is constructed on a P+ conductivity type substrate 11, having a P– type conductivity layer, such as an epitaxially grown layer 12, thereon, as shown in FIG. 1a. The epitaxial layer 12 may be, for example, initially of about 21 $\mu$m thick, and may serve as a P tank for associated CMOS logic circuitry (not shown), or the like. After completion of the various diffusions and impurity drive-in steps, the final thickness of the epitaxial layer will be about 9 $\mu$m, due to the up-diffusion of the substrate impurity dopant into the P– epitaxial region, which has a lower doping concentration.

In the construction of the vertical PNP transistor, an N conductivity type isolation region 14 is first formed in the epitaxial layer 12. The isolation region 14 may be formed, for example, by providing an opening or window 15 in a photomask 16, and introducing a donor type impurity such as antimony or, preferably, phosphorus 17 into the epitaxial layer 14. (The photomask 16, and other photomasks described herein, may be formed on a buffer oxide layer, as is well known.) It should be noted that the isolation layer 14 ultimately provided by the N type dopant within the epitaxial layer 12 will be diffused by a diffusion drive-in process to or near the interface between the epitaxial layer 12 and the substrate 11, so at the processing stage shown in FIG. 1a, the relative initial implantation doping dose of the N type dopant may be relatively high, for example of about $4 \times 10^{12}$ cm$^{-2}$ at about 80 KeV. After the photomask 16 has been removed, the initial impurity may be driven in for a time preferably of about 700 minutes, at a temperature of between about 1000° C. and 1350° C., preferably about 1200° C. As mentioned, after the drive in processes to which the dopant is exposed, the final N– isolation region provided by the N type dopant will be lightly doped with N type impurity at a level of, for example, $8 \times 10^{15}$ cm$^{-3}$. The lightly doped isolation region ultimately will surround or contain all of the vertical transistor elements.

Figure 1B:
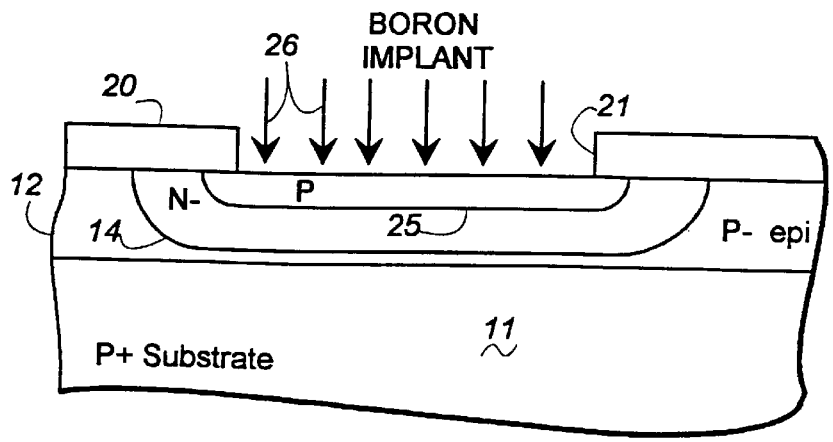
Figure 1C:
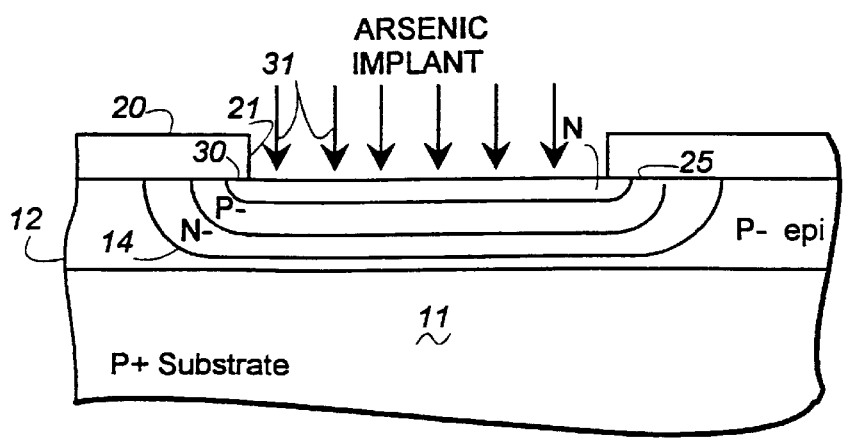

Next, another photomask 20 is applied, as shown in FIGS. 1b and 1c, to provide a window 21 through which both the collector and base of the transistor will be introduced. The window 21 is of smaller dimension than the window 15 through which the isolation layer 14 was diffused, so that the collector and base structures are entirely contained within the isolation region 14. The collector region 25 is partially formed by implanting an acceptor impurity, such as boron 26, through the window 21 into the isolation layer 14 at a dose of about $6.75 \times 10^{13}$ cm$^{-2}$ at an energy of about 100±10 KeV.

Using the same window 21 in the photomask 20, the base region 30 is next partially formed, as shown in FIG. 1c. Since the base region 30 is formed by implantation through the same mask window 21 used in the formation of the collector region 25, the base region 30 and collector region 25 will be self-aligned each with respect to the other. The base region 30 is formed by implanting a donor impurity such as phosphorous or, preferably, arsenic 31 with a dose of about $1 \times 10^{14}$ cm$^{-2}$ at an energy of about 150±10 KeV into the collector region 25 formed in the preceding step. After the mask 20 has been removed, the base and collector diffusions are performed simultaneously at a temperature of between about 1000° C. and 1100° C., preferably about 1100° C., preferably for a time of about 500 minutes. As the diffusions are being carried out, the collector region 25 and the base region 30 codiffuse, forming a double diffused region. The boron collector 25 outdiffuses the arsenic base region 30 due to the difference in the diffusion coefficients of the boron and the arsenic. In the meantime, the isolation region 14 continues to diffuse further laterally outwardly from the window 21 and downwardly toward the interface between the epitaxial region 12 and substrate 11.

Figure 1D:
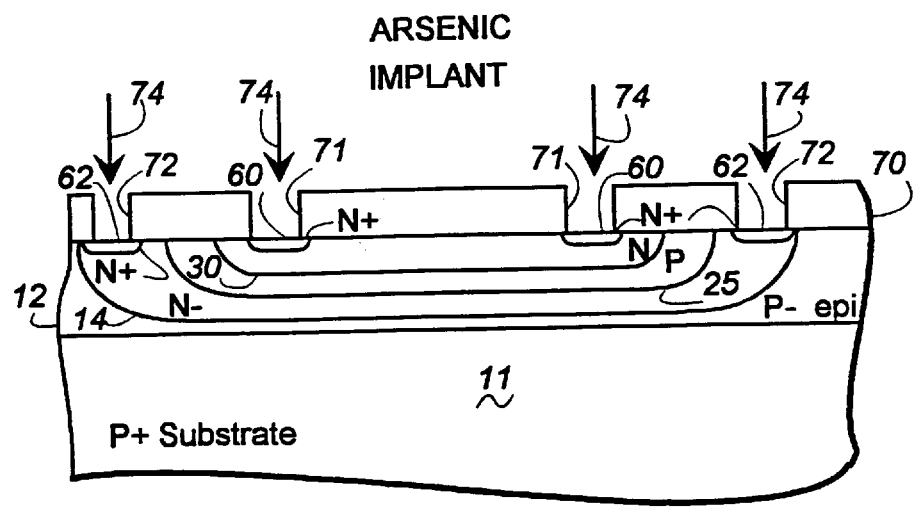

Next, as shown in FIG. 1d, the base contact regions 60 and isolation contact regions 62 are formed. These contact regions 60 and 62 are formed by constructing another photomask 70 on the surface of the epitaxial region 14 and forming windows 71 and 72, respectively, above the base and isolation regions at which the contacts 60 and 62 are to be formed. A donor impurity such as phosphorus or, preferably, arsenic 74 is then implanted with a dose of between about $1 \times 10^{15}$ cm$^{-2}$ and $5.5 \times 10^{15}$ cm$^{-2}$, preferably about $5 \times 10^{15}$ cm$^{-2}$ at an energy of between about 100 KeV and 150 KeV, preferably about 120 KeV. After the photomask 70 has been removed, a diffusion may be carried out at a temperature of between about 800° C. and 1000° C., preferably about 900° C., for a time of between about 2 to 1000 minutes, preferably about 100 minutes, into the contact regions 60 and 62 of the base and isolation layer contact regions 30 and 14.

Figure 1E:
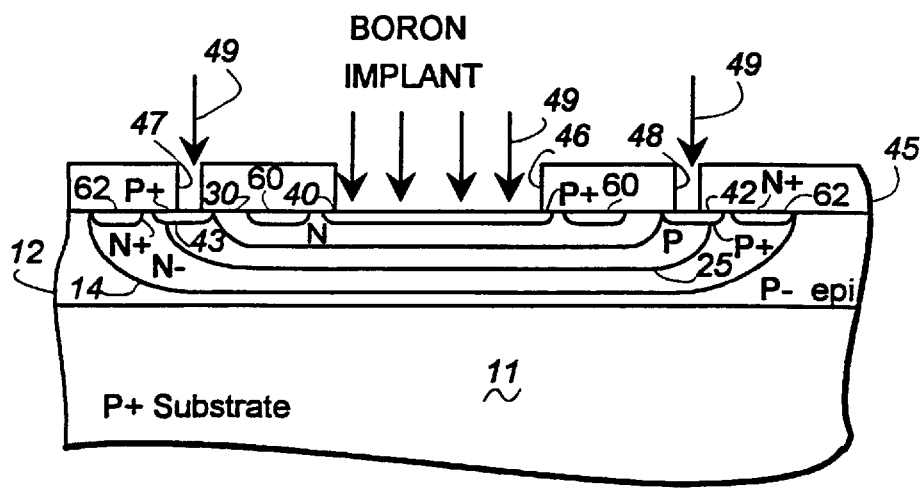

Finally, as shown in FIG. 1e, the emitter 40 and the collector contacts 42 and 43 are next formed. A photomask 45 is formed on the surface of the epitaxial layer 12, and windows 46, 47, and 48 are formed, respectively, for the emitter diffusion and the diffusion forming the collector contacts 42 and 43. The emitter is formed by implanting an acceptor impurity such as boron 49 into the base region 30 at a dose of about $2\times10^{15}$ cm$^{-2}$ at an energy of about 25 KeV±5 KeV. After the photomask mask 45 is removed, the boron is diffused into the base layer 30 and exposed regions of the collector 25 at a temperature of between about 800° C. and 1000° C., preferably about 900° C., for a time of between about 2 minutes to 1500 minutes, preferably about 65 minutes to form the emitter region 40 and collector contact regions 42 and 43.

By controlling the diffusion times and temperatures of the various impurity diffusions, described above, the isolation region may be dimensioned to have a final thickness about the same as that of the final thickness of the epitaxial region 12, or about 9 µm. The collector region 25 may be dimensioned to have a depth from the surface of the structure of about 2.7 µm, with the base and emitter having respectively thicknesses from the surface of about 0.5 µm and 0.4 µm. The thicknesses of the diffused regions, of course, is measured to the junction of the respective regions with the next adjacent region, the impurities having a continuous profile, but providing a junction at a location at which the numbers of impurities of the respective adjacent layers or regions are equal. Also, it should be noted that since the diffusion constant of boron and arsenic are well established, the base thickness can be controlled to create a base region of desired, controllable width. For example, with the structure constructed as described above, the collector region 25 will have a thickness of about 2.2 µm, the base will have a thickness of about 0.1 µm, and the emitter will have a thickness of about 0.4 µm. The construction of the integrated circuit with which the completed PNP transistor device formed in accordance with the foregoing process steps is associated may be then completed, including forming interconnects to the various transistor region contact areas described above.

Although vertical PNP transistors typically are limited to applications in which the transistor is connected in common-collector (or emitter-follower) configurations, it will be appreciated that since the collector region 25 of the transistor of the invention is isolated from the substrate 11 by the surrounding isolation layer 14, the transistor of the invention can be used in the same configurations as lateral PNP transistors, without such common-collector limitation.

Also, since the base 30 can be made more heavily doped than the collector 25 (as shown), the width of the depletion region of the base collector junction can be made very small, enabling base geometries that are also very small, even at relatively high collector voltages. The transistor structure is therefore compatible with submicron, dense IC circuitry, such as high density logic circuitry as may be constructed in P– epitaxial layers on a P+ substrate.

It should be noted that although the invention is described in the context of semiconductor structures having certain conductivities, and of certain materials, the particular materials and conductivity levels disclosed are only exemplary, and that those skilled in the art will recognize that other types of materials may be equally advantageously employed. For example, the invention can be carried out on semiconductors other than silicon, can have various other donor or acceptor dopants, or can have various other doping levels from those specifically described.

Also, although the process for making the PNP transistor invention has been described in terms of multiple impurity diffusions to form the various layers or transistor regions, it should be noted that other ion introduction techniques may be used. For example, the various layers may be formed by ion implantation techniques, controlling the peak concentration depths, or may be formed using a combination of ion implantation followed by drive-in diffusion techniques to position the junctions of the structure.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A method of forming a PNP transistor, comprising:

forming a surface layer of P– conductivity at a surface of a P+ substrate;

forming an isolation region of N– conductivity in said surface layer;

forming a collector region of P– conductivity in said isolation region by implanting an acceptor impurity through a window, defined by a mask, into said surface layer resulting in the isolation region surrounding and containing said collector region;

forming a base region of N conductivity in said collector region by implanting a donor impurity through said window into said collector region resulting in the collector region surrounding and containing said base region;

performing co-diffusion of said base and collector region; and forming an emitter region of P+ conductivity in said base region.

2. The method of claim 1 wherein said step of forming a layer of P– type conductivity at a surface of a P+ type substrate comprises epitaxially depositing a P– type layer on said substrate.

* * * * *